United States Patent [19]

Hatch et al.

[11] 4,239,583

[45] Dec. 16, 1980

[54] METHOD AND APPARATUS FOR CRYSTAL GROWTH CONTROL

[75] Inventors: Arthur E. Hatch, Waltham; Douglas A. Yates, Burlington, both of Mass.

[73] Assignee: Mobil Tyco Solar Energy Corporation, Waltham, Mass.

[21] Appl. No.: 46,552

[22] Filed: Jun. 7, 1979

Related U.S. Application Data

[63] Continuation of Ser. No. 798,456, May 19, 1977.

[51] Int. Cl.³ .............................................. C03B 15/34
[52] U.S. Cl. ............................... 156/601; 156/617 SP; 156/619; 422/246; 422/249
[58] Field of Search ................ 156/601, 617 SP, 608, 156/619, DIG. 73, DIG. 88; 422/246, 249

[56] References Cited

U.S. PATENT DOCUMENTS

| | | | |
|---|---|---|---|
| 2,809,136 | 10/1957 | Mortimer | 156/608 |
| 3,051,035 | 8/1962 | Root | 156/601 |
| 3,096,158 | 7/1963 | Gaule et al. | 156/608 |
| 3,130,040 | 4/1964 | Faust | 156/617 SP |
| 3,499,736 | 3/1970 | Zwaneburg | 156/617 SP |
| 3,507,625 | 4/1970 | Dryris | 156/617 SP |
| 3,692,499 | 9/1972 | Andrychuk | 156/617 SP |
| 3,701,636 | 10/1972 | LaBelle | 156/608 |
| 3,704,563 | 6/1973 | Reichard | 156/617 SP |
| 3,718,757 | 2/1973 | Gvlitz | 156/617 SP |
| 3,958,129 | 5/1976 | Clement | 156/601 |

*Primary Examiner*—Hiram H. Bernstein
*Attorney, Agent, or Firm*—Schiller & Pandiscio

[57] ABSTRACT

A system for and method of growing a crystalline body of a selected material is described, whereby the body grown is of a selected cross-sectional shape. The system and method are used in accordance with known capillary die techniques and further includes observing opposite edge portions of the growing body, preferably just above the meniscus (of melt material from which the body is being pulled). The cross-sectional size of the growing crystalline body can be controlled by determining when horizontal shifts occur in the edge portions relative to each other as well as the same predetermined reference position.

25 Claims, 11 Drawing Figures

METHOD AND APPARATUS FOR CRYSTAL GROWTH CONTROL

COPENDING APPLICATION

This application is a continuation application of U.S. Ser. No. 798,456 filed May 19, 1977.

This invention pertains to the growth of crystalline bodies having a predetermined cross-section and more particularly to improvements in processes of growing such crystalline bodies.

Various processes are now known for growing crystalline bodies. One such process, hereinafter referred to as the "capillary die process", generally utilizes a capillary die or forming member from which the crystalline body can be grown. The process can be carried out in accordance with various techniques. By way of example, one such technique is described in U.S. Pat. No. 3,591,348 in which bodies are grown in accordance with the edge-defined film-fed growth technique (also known as the EFG Process). In this technique the cross-sectional shape of the crystalline body is determined in part by the external or edge configuration of the top end surface of the capillary die member. The process involves growth of a seed from a liquid film of feed material sandwiched between the growing body and the top end surface of the die member with the liquid in the film being continuously replenished from a suitable melt reservoir via one or more capillaries in the die member. By appropriately controlling the pulling speed of the growing body and the temperature of the liquid film, the film can be made to spread (under the influence of the surface tension at its periphery) across the full expanse of the top end surface formed by the intersection of that surface with the side surface or surfaces of the die member. The growing body grows to the shape of the film which conforms to the edge configuration of the die member's top end surface. Since the liquid film has no way of discriminating between an outside edge and an inside edge of the die's top end surface, a continuous hole may be grown in the crystalline body by providing in that surface a blind hole the same shape as the hole desired in the body, provided, however that any such hole in the die member's top end surface is made large enough so that surface tension will not cause the film around the hole to fill in over the hole.

Another example of the capillary die process for growing crystalline bodies is described in U.S. Pat. No. 3,471,266. This technique employs a forming or die member that defines a capillary which contains a column of melt from which a crystalline body is grown and pulled. Depending upon the cross-sectional configuration of the capillary and by appropriate control of the thermal conditions in the upper end of the column of melt contained in the capillary, it is possible to grow crystalline bodies of selected material having arbitrary selected cross-sectional shapes. Thus, by employing a forming die member having a capillary in the shape of an annulus, it is possible to grow a hollow tube. The forming member is mounted so that the capillary is connected to a reservoir pool of melt, whereby the capillary is self-filling.

In capillary die processes, such as the two types described, changes in pulling speed and the temperature distribution, i.e., thermal gradients at the top end of the die member and in the melt near the solid/liquid growth interface (formed where the growing crystalline body joins the liquid film) can affect the cross-sectional size of the growing body. Since it is a relatively easy matter to hold the pulling speed constant, the usual practice, once the crystalline body is growing to the desired shape, is to fix the pulling speed at a suitable rate and to adjust the interface temperature gradients (by adjusting the rate of heating) so that the body will grow to the desired size.

Accordingly, it is desirable to monitor the growing body so as to keep the temperature gradients and the pulling speed within prescribed tolerance limits. Several monitoring systems and techniques are known. For example, a technique described in U.S. Pat. No. 3,870,477 issued to LaBelle is predicated upon the fact that capillary die processes of growing crystalline bodies are characterized by the presence of a meniscus of melt extending between an edge of the die member and the solid/liquid growth interface. The height of (and the degree of concavity) of the meniscus can change with changes in the operating conditions. More importantly, the height of the meniscus is affected by the temperature of the melt in the region of the solid/liquid growth interface and the pulling speed, and that the outer diameter of a hollow tube or solid rod or the thickness and width of a flat ribbon will decrease as the meniscus height increases (and an increase in the same diameter or width occurs if the outer meniscus height decreases).

A system described and claimed in our U.S. copending application No. 778,577 filed Mar. 17, 1977 now U.S. Pat. No. 4,185,076 monitors meniscus height by taking advantage of the discovery that during the capillary die processes the meniscus joins the crystalline body at the solid/liquid/vapor junction (the junction formed at the intersection of the solid-liquid interface and the surrounding vapor) at a discernable meniscus angle. The term "meniscus angle" designed hereinafter as $\phi$, shall therefore mean the angle formed by the meniscus surface (the liquid/vapor interface) with the surface of the solid crystalline body (the solid/vapor interface) at the solid/liquid/vapor junction. During the growth of a uniformly dimensioned crystalline body, i.e. during steady state conditions when the pulling speed of the crystalline body as well as temperature gradients near the solid/liquid growth interface are substantially constant, the surface of the crystalline body, i.e. the solid/vapor interface is parallel to the pulling axis. It has been found that for at least some materials, such as silicon and germanium, during these steady state conditions, the "steady-state meniscus angle", $\phi_0$ is substantially constant at some unique value depending upon the material (see Surek, T. and Chalmers, B; "The Direction of Growth of the Surface of a Crystal in Contact with Its Melt"; *Journal of Crystal Growth;* Volumn 29, pp. 1–11 (1975)).

For silicon, for example, the steady state meniscus angle is $11°\pm1°$, while for germanium approximately $8°$. It has further been observed that, at least for silicon, the steady state meniscus angle will not be appreciably affected by variations of nearly two orders or magnitude in the crystal growth rate even though changes in meniscus height will occur.

The system of our U.S. copending application No. 778,577 now U.S. Pat. No. 4,185,076 accordingly comprises means for observing during a capillary die process at least a portion of the solid crystalline body and the meniscus including the solid/liquid/vapor junction, for quantities of radiation (at wavelengths to which the crystalline material is at least partially reflective) reflected in a direction substantially perpendicular to the meniscus surface formed at the solid/liquid/vapor junction when steady state conditions exist. By determining the spatial portion where a sharp change (or contrast) in the reflected radiation occurs, and referencing that position relative to some reference spatial position, the speed at which the crystalline body is pulled or the temperature of the growth pool of melt can be maintained so that the position exhibiting the sharp contrast can be controlled relative to the reference position. Although maximum contrast is achieved by observing the solid/liquid/vapor junction at an angle perpendicular to the surface of the meniscus at the junction, the meiscus height control technique can be accomplished by observing the surface at the junction at an angle which varies from the perpendicular so long as a discernable contrast arising from the reflected radiation from the meniscus and body surfaces exists.

The meniscus height control technique thus described is particularly useful in growing crystalline bodies which are of a closed geometric shape (for example, cylinders or rods) which have no edges or growing flat sheet crystals having stable edges.

It has been observed, however, that at least in the situations where the crystalline bodies being grown are of an open geometry (those bodies formed with oppositely disposed edges, e.g. a flat ribbon) relatively small changes in meniscus height produce relatively large changes in the crosssectional dimensions, most notably in the width, of the growing crystalline body. Thus, increased heating or pulling speed increases meniscus height and causes the cross-sectional dimensions, especially the width, of the body to decrease. Conversely, decreased heating or pulling speed decreases the meniscus height and may also cause the cross-sectional dimensions of the body to increase. Accordingly, it has been found that using the system described in our U.S. copending application and described in detail hereinafter, even though meniscus height can be effectively controlled within very close tolerances, at least in the open geometry case, changes in the crosssectional dimensions, particularly the width, of the crystalline body being grown can still occur.

Accordingly, it is an object of the present invention to provide an improved apparatus for and method of monitoring and controlling crystal growth so that the cross-sectional dimensions of the growing body is within prescribed limits.

Another object of the present invention is to provide an improved apparatus for and method of automatically monitoring and controlling the growth of crystalline bodies, such as silicon, so that the cross-sectional dimensions of the growing body are substantially constant.

A further object of the present invention is to provide an improved apparatus for and method of controlling and monitoring growth of crystalline bodies which includes all of the advantages of the meniscus height control system and technique described in our U.S. copending application 778,577 now U.S. Pat. No. 4,185,076 and described hereinafter.

And yet another object of the present invention is to provide an improved method of and apparatus for controlling and monitoring crystal growth by monitoring the cross-sectional dimensions of the crystalline body.

Systems for monitoring the width of a growing crystalline body are known. For example, U.S. Pat. No. 3,449,736 issued to Zwaneburg discloses a system for controlling the growth of a crystalline (grown in accordance with the Czochralski method) body in a furnace of the type having a high frequency coil heater, which heats the melt material in the crucible of the furnace. In this type of furnace visible observation of the meniscus and the position of the body of the crystal where it joins the meniscus is difficult if not impossible. Accordingly, a beam of X-rays or gamma radiation is directed through the portion of the furnace where the meniscus is located to an X-ray screen, adapted to provide a visible image of the meniscus melt and crystalling body and suitably calibrated so as to measure the diameter of the crystal body being grown. Manual adjustment of the melt temperature or the pulling speeds can be made when an increase or a reduction of the crystal diameter occurs. Alternatively, photocells can be placed behind the X-ray screen at the level of the growing portion so that when the correct diameter is reached the photocells automatically control the pulling rate and/or the current supplied to the high-frequency coil by an appropriate control circuit. "Opto-electric converters" may be substituted for the photocells by placing the former in front of the X-ray screen or when the screen has been temporarily removed. The converters are described as being arranged in a known manner and the control-circuits employed thereto are known as well although the patent is silent as to any arrangement of the converter or any suggestion of a specific control circuit.

It is therefore another object of the present invention to provide an improved and accurate method of and apparatus for monitoring and controlling the growth of crystalline bodies of an open geometry type, by separately, independently and accurately controlling the position of each of the edges of the crystalline body with respect to each other and relative to a predetermined reference position.

Another object of the present invention is to provide an improved method of and apparatus for monitoring and controlling the cross-sectional width of crystalline bodies grown in accordance with a capillary die process.

And another object of the present invention is to provide an improved method of and apparatus for selectively controlling each of a plurality of heaters so as to control the growth of crystalline bodies.

The foregoing and other objects of the present invention are achieved by observing during a capillary die process at least a portion of the solid crystalline body and a contrasting background beyond the body at each of two oppositely disposed edges of the body just above the meniscus, and monitoring the lateral positions of the edges relative to some fixed reference positions. By separately and independently monitoring the relative positions of the opposing edges, the speed at which the crystalline body is pulled or the appropriate thermal conditions can be maintained so that the cross-sectional dimensions of the growing crystalline body can be controlled.

Other features and specific details of this invention are set forth in the following description which is to be considered together with the drawings wherein.

Figure 1:
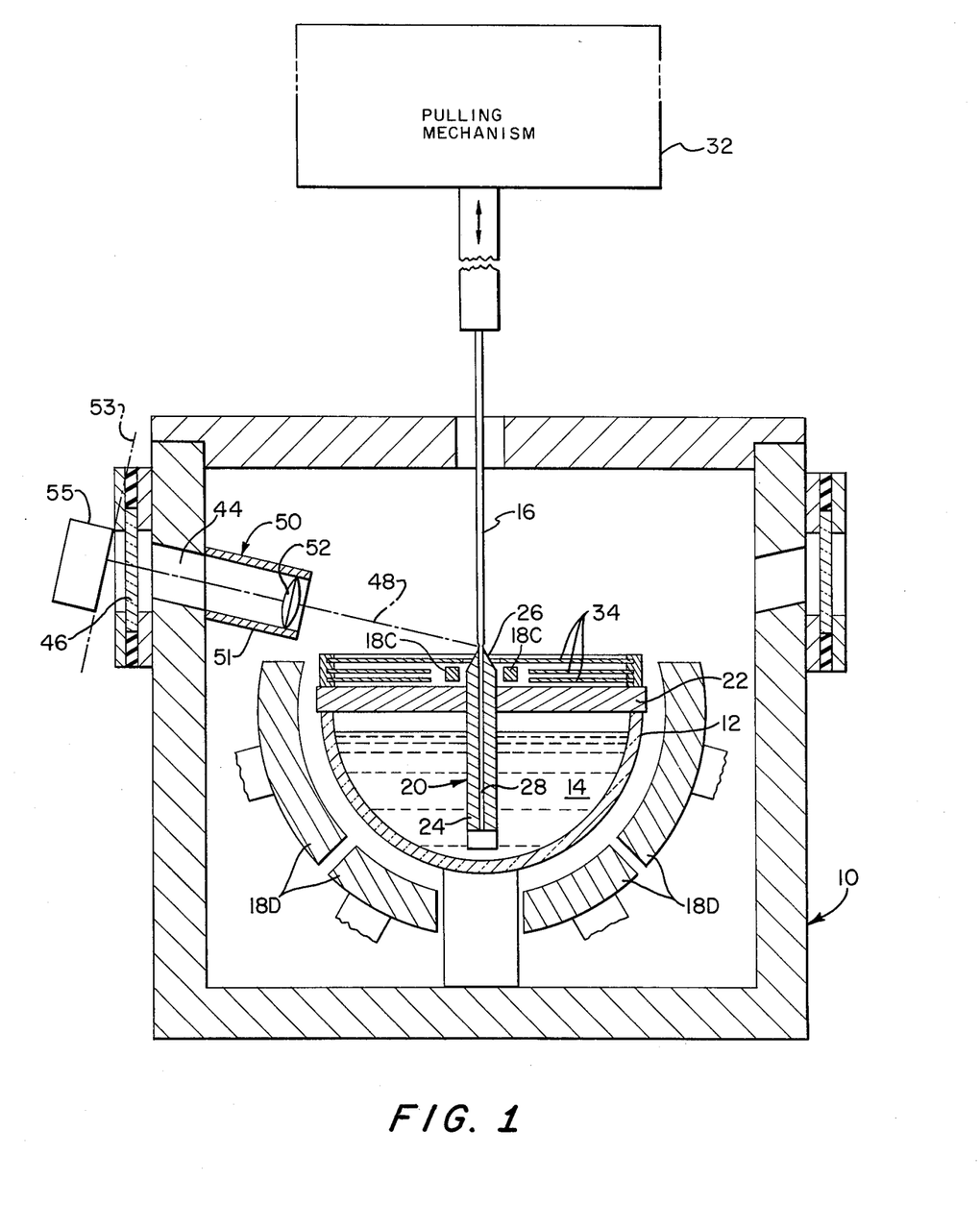
FIG. 1 is a sectional view in elevation, of a crystal growing furnace with certain parts represented schematically, and illustrates the growth of a crystalline body according to a capillary die process incorporating the present invention.

Referring to FIG. 1, a furnace 10 of the type for growing crystalline bodies of an open geometric shape in accordance with capillary die processes is provided with a suitably supported crucible 12. The crucible contains a crystalline melt material 14 from which the crystalline body 16 is to be grown, the melt material being maintained at a predetermined temperature by one or more heater elements 18. In the type of furnace shown the heater elements include main crucible heaters 18D, face heaters 18C (shown in cross-section in FIG. 1 and schematically in FIG. 5) which extend horizontally across the face of the crucible and end heaters 18A and 18B (shown schematically in FIG. 5) which extend horizontally across the end or top of the crucible. A suitable capillary die or forming member 20 is supported by the plate 22 resting on the crucible so that the bottom 24 of the die member extends into the melt material 14 while the top 26 of the die member extends above the plate 22. The capillary die member 20, as shown, is similar to the type of the die member employed in the EFG process previously mentioned and described in detail in U.S. Pat. No. 3,591,348. Generally, the cross-sectional shape of the crystalline body 16 is determined by the external or edge configuration of the upper or top end 26 of the die member 20. By way of example, the die may be designed for growing a thin flat ribbon of an open geometrical design, in which case FIG. 1 may be considered as presenting a side edge view of the die with the longer horizontal dimension of the ribbon, i.e., its width, being perpendicular to the plane of the drawing (and shown in FIG. 5). Such a die member is preferably oriented so that when a flat ribbon is being grown, the longer dimensioned sides of the ribbon are disposed in a parallel-spaced relationship with the general plane in which the face heaters 18C are disposed so that the latter generally provide uniform heat across the face of the top 26 of the die member. Similarly, the end heaters 18A and 18B (of FIG. 5) are disposed at the opposite edges of the top edges of the die member so that heat is provided to the top edge of the top 26 of the die member and the portion of the meniscus film, both adjacent the particular heater. Thus, heaters 18 are utilized to control the temperature distribution across the top of the die member in the melt material forming the meniscus near the liquid/solid interface 36.

Figure 2:
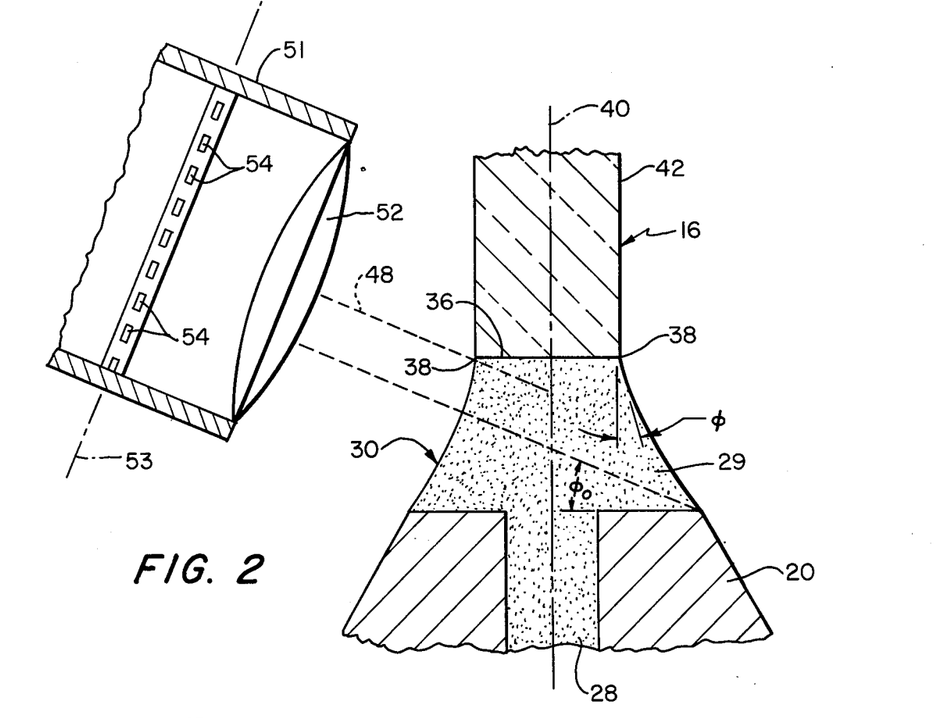
FIG. 2 is a schematic view of an enlarged scale illustrating a portion of the meniscus height control system described in our copending application.

As shown more clearly in FIG. 2, the die member 20 includes at least one capillary 28 so that the liquid in the meniscus film 29 formed between the top of the die member 20 and the crystalline body 16 can be continuously replenished from the reservoir of melt material 14 as the body 16 is being pulled. The body 16 is pulled at a constant speed along a pulling axis by the pulling mechanism 32. In order to provide a more uniform temperature of the meniscus during steady state conditions, a plurality of thin radiation shields 34 are provided on the plate 22 around the die member 20 so as to help maintain a uniform temperature of the melt material 14.

As shown more clearly in FIG. 2, the meniscus 30 of film 29 intersects the body 16 at the solid/liquid interface 36, which in turn forms the solid/liquid/vapor junction 38. As previously described, during steady state conditions (when the body 16 is being pulled at a constant speed and the temperature distribution in the melt material is substantially constant so that the cross-sectional dimensions are substantially constant) the solid/vapor interface 42, i.e., the surface of body 16, is parallel to the pulling axis 40. By extending the interface 42, the meniscus angle $\phi$ is formed with respect to the surface of the meniscus 30 at the junction 38 as shown.

Using the meniscus height control system of our copending U.S. application No. 778,577 now U.S. Pat. No. 4,185,076 at least a portion of the body 16 and meniscus 30 including the solid/liquid/vapor junction 38 is viewed at an angle perpendicular to the surface of the meniscus formed at the junction under steady state conditions. Accordingly, the furnace 10 of FIG. 1 is provided with one or more viewing ports 44 provided with corresponding windows 46 and located so that the portions of the body and meniscus can be viewed at this angle along the viewing axis 48. It will be appreciated that since the pulling axis 40 is vertical, the viewing axis is preferably oriented at the complement of the steady state meniscus angle $\phi_0$ with respect to the pulling axis. Thus, for furnaces where silicon is to be grown, each port 44 is located so that its viewing axis 48 intersects the meniscus at an approximate 11° angle with the horizontal or conversely at an approximate 79° angle with respect to the pulling axis. The line of demarcation thus formed by the sharp change in contrast at the solid/liquid/vapor junction 38 can be viewed with suitable sensing means or sensor 50 provided at one or more of the ports 44 along the corresponding axis 48 to determine if the line shifts relative to some fixed referenced position such as the top of the die member 20. When shifts occur, the speed at which the body 16 is being pulled or the temperature of the growth pool of melt 14 can be adjusted so that the line of demarcation indicating the solid/liquid/vapor junction 38 will return to its correct position.

As shown in FIG. 1 and more particularly in FIG. 2, the sensor 50 includes a lens 52 properly mounted in a cool tube 51 (the latter preferably is cooled by having a cooling fluid flowing therethrough) and positioned along viewing axis 48. Alternatively lens 52 can be located outside of the furnace along the optical axis 48. Lens 52 forms an image of at least a portion of the body 16 and meniscus 30 in the image plane 53. The lens is designed to provide any desired magnification of the image of the portion of the body 16 and meniscus 30 depending upon the resolution and accuracy of control desired. A lens having a magnification of 2 has been found satisfactory although a lens providing anywhere from 1 to 5 times magnification is equally satisfactory. Each sensor 50 also includes means, positioned with respect to the image plane 53 for observing the vertical position of the solid/liquid/vapor junction 38.

Referring to FIG. 2, the means for observing the junction 38 preferably includes a plurality of radiation detectors 54 arranged in a linear array oriented, generally vertically, in a direction perpendicular to the viewing axis 48 and coplanar with the image plane 53. Detectors 54 are each of a type which provides an electrical output signal, the magnitude of which is proportional to the amount of radiation, within a predetermined waveband, which is received by the detector. The waveband to which detectors 54 are sensitive includes radiation to which the body 16 and meniscus 30 are at least partially reflective. It will be appreciated therefore that the amount of reflected radiation within the waveband of reflected radiation that is necessary for the present invention to operate is dependent in part upon the sensitivity of detectors 54 and the reflectivity of the crystalline material at a particular wavelengths. For example, silicon exhibits a high reflectivity, i.e., approximately 38%, at $0.5\mu$. By employing detectors which are sensitive to radiation at $0.5\mu$, the position of the junction 38 can be ascertained by observing the position to the discontinuous change in the amount of radiation at $0.5\mu$ received by the detectors. Such detectors are commercially available. For example, "linear-imaging devices" (LIDs) or "linear-imaging sensors" (LISs), such as, for example, the CCD-110 system from the Fairchild Camera Instrument Corporation of Mountain View California, can be used.

In an alternative embodiment the lens 52 is replaced by a coherent optical fiber bundle 57 (shown schematically in FIG. 6), whereby each fiber of the bundle transmits the amount of radiation received at one end to its other end. The latter end of each optical fiber of the bundle is preferably positioned adjacent a corresponding one of the detectors 54.

In the preferred embodiment, the means for observing the vertical position of the junction 38 as well as means for controlling the growth of the crystalline body 16 are provided in the form of a meniscus height control system 55, shown positioned in FIG. 1.

Figure 3:
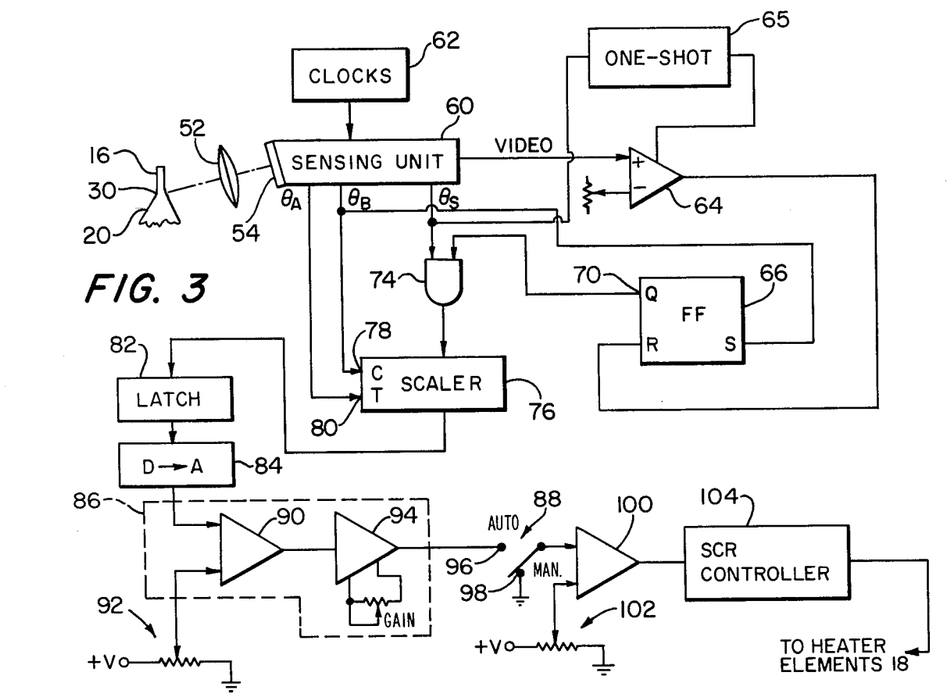
FIG. 3 is a schematic block diagram of the meniscus height control system of our copending application.
Figure 4:
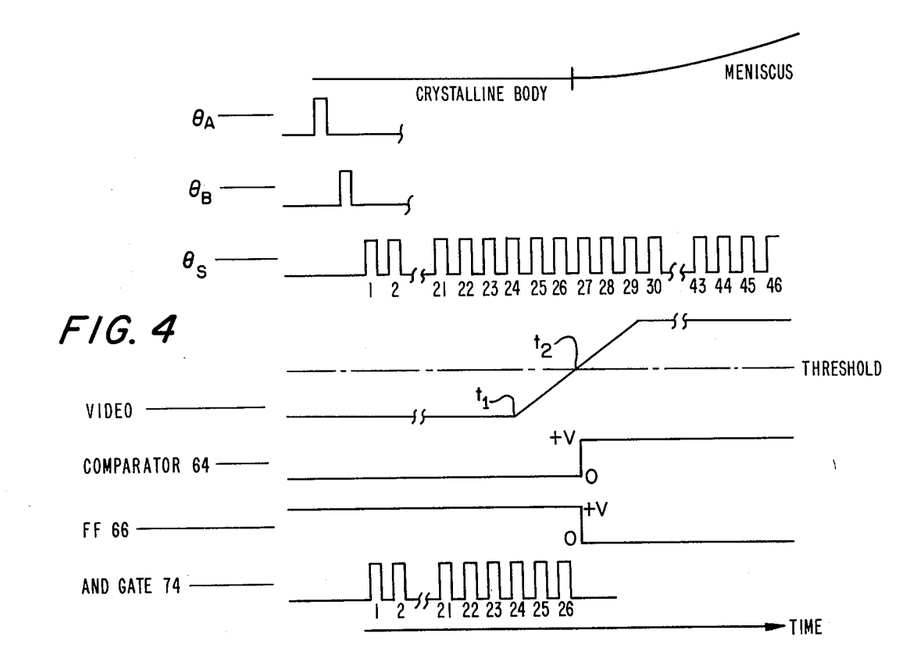
FIG. 4 is an exemplary timing diagram of the block diagram of FIG. 3.

Referring to FIG. 3, the preferred circuit of our meniscus height control is shown as including the CCD-110 system generally referred to as sensing unit 60. In addition to detectors 54, the sensing unit includes an analog shift register (not shown) for simultaneously storing the output values of the individual detectors, all of the latter sensing the radiation received at the same instant of time. The unit may include its own clocking circuitry or in the alternative clocks 62 may be provided as shown. Unit 60 provides four output signals from four corresponding output terminals. The first output signal is hereinafter designated the transfer pulse $\theta_A$. The second output is hereinafter designated the clearing or reset pulse $\theta_B$ and is provided subsequently to $\theta_A$. Both pulses are shown in the timing diagram of FIG. 4. After the second output pulse, the unit then provides a clock or strobe signal $\theta_s$ (which includes a series of pulses) and a video output signal, both shown in the timing diagram of FIG. 4. The video signal, shown as a continuous signal in FIG. 4 is actually a series of pulsed analog signals representative of the outputs of the corresponding detectors stored in the analog shift register.

However, the amplitude of the signal is negative in polarity (assuming no D.C. bias) and proportional to the intensity of the radiation detected by the particular detector. Thus, assuming no D.C. bias, the amplitude of the signal is zero in the absence of radiation and of a negative amplitude proportional to the intensity of radiation when such radiation is present. By way of example, as shown in FIG. 4, when the 21st clock pulse is provided, the amplitude of the video signal corresponds to the amount of radiation detected by the 21st detector. Similarly, the amplitude of the video signal occuring during the time of the 22nd clock pulse corresponds to the amount of radiation detected by the 22nd detector. The video output of unit 60 is connected to the positive input of a comparator 64. The negative input of comparator 64 is connected to an adjustable DC voltage source. The latter provides the threshold level of the comparator. Generally, the output of comparator 64 is at a low or negative logic state so long as the voltage at the positive input is below the threshold voltage at its negative input. The output of comparator 64, however, changes to a high or positive logic state when the voltage at its positive input exceeds the reference voltage (threshold level) at its negative input. One shot 65 having an input for receiving the clock signal $\theta_s$, has its output connected to the strobe input of comparator 64, so that the latter only compares the amplitude of each pulse signal of the video output with the reference voltage. The output of comparator 64 is connected to the clearing or reset input of a J-K flip-flop 66, with the set input of the latter being adapted to receive the $\theta_B$ output pulse from unit 60. Generally, flip-flop 66 operates so that its Q output 70 goes to a high logic state (positive voltage) when the $\theta_B$ pulse is received at its setting input. The Q output will remain high until the reset input receives a positive voltage pulse from the output of comparator 64, whereupon the Q output of the flip-flop will go to a low logic state (zero or some negative voltage) and remain in that state until the next $\theta_B$ pulse is received at the reset input. The Q output 70 of flip-flop 66 and the clocking output of unit 60 are connected to two inputs of AND gate 74. The latter will provide an output in a high logic state so long as its two inputs are high; otherwise the output is low. The output of gate 74 is connected to the input of a scaler 76. The latter has its clearing input 78 and its transfer input 80 connected to receive, respectively, the clearing pulse $\theta_B$ and the transfer pulse $\theta_A$ from the unit 60. Scalers are generally well known in the art, and, for example, the scaler 76 may be a frequency counter providing a binary output. Generally, scaler 76 counts the number of pulses of the clock signal received from the output of gate 74 when the latter is enabled by the Q output of flip-flop 66. This number is jam transferred to latch 82 when the transfer pulse O $\theta_A$ is received at the transfer input 80 of the scaler 76.

The latch 82 generally holds this signal provided from scaler 76 until an update is received from the scaler. Accordingly, latch 82 may be a register or similar device. The digital output of latch 82 is converted to an analog signal by the digital-to analog-converter 84. The analog output of converter 84 is signal conditioned by amplifier 86 to the switch 88. Amplifier 86 includes a summing amplifier 90 having one input connected to receive the output of the converter 84 and its other input to a variable voltage source 92 to perform manual zero adjustment of the output of amplifier 90 to zero volts. Summing amplifier 90 sums the two voltage signals at its input and provides a particular signal level output to the input of a controller 94 having a manually adjustable gain. The controller essentially provides an output signal proportional to its input, the proportionality factor being dependent upon the gain set. The output of controller 94 is connected to the auto terminal 96 of switch 88, with the manual terminal 98 being connected to ground. The common terminal of the switch is connected to one input of a second summing amplifier 100. The latter has its other input connected to a manually adjustable voltage source 102 for varying the voltage input and its output connected to the input of an SCR controller 104. The latter provides an output which is proportional to its input so as to provide a voltage suitable for controlling heater elements and in particular the face heaters 18C shown in FIG. 1.

In an alternative embodiment, the common terminal of the switch is connected to the summing junction of a controller such as the ELECTROMAX III manufactured by Leeds and Northrup of North Wales, Pennsylvania although other controllers can be used. The summing junction of such a controller can be utilized to sum the output of the amplifier 86, a thermocouple positioned in the crucible 12 (or preferably near the top end 26 of the die member 20 in order to measure the melt temperature to be controlled), and a signal provided from a manual control such as a voltage-biased manually-adjustable potentiometer.

In operation, the sensor 50 together with the control system 55 of the meniscus height control is properly positioned with respect to port 44 so as to observe the meniscus 30 at the steady state meniscus angle along axis 48. Where silicon is being grown, axis 48 is preferably oriented at 11° with respect to the horizontal, while germanium requires the axis to be oriented at about 8° with respect to the horizontal. As the crystal is growing, the monitoring system is designed to continually monitor and control the location of the solid/liquid interface 36 relative to some fixed position such as the top of the die member 20. Referring to the timing diagram of FIG. 4, the first pulse provided is the transfer pulse $\theta_A$. As will be more apparent hereinafter, the transfer pulse jam transfers the value in the scaler 76 from the previous scan into latch 82. The next pulse $\theta_B$ clears the scaler 76 for the next scan and resets flip-flop 66 so that the Q output 70 of the flip-flop goes high and gate 74 is enabled. As previously described, signals representative of the amount of radiation received by the detectors 54 are simultaneously stored in the analog shift register of sensing unit 60 and subsequently provided as the series of pulse analog video output signals. With the scaler 76 cleared, a clock pulse $\theta_S$ is provided for each video pulse shifted out of the analog shift register and provided at the video output of the unit 60. Each of these clock pulses is counted in the scaler so long as the AND gate 74 is enabled. The amplitude of the video signal is continually compared to the threshold level set at the negative input of comparator 64. Since some reflected radiation is received by the detectors positioned to receive radiation reflected from the crystalline body 16, the amplitude of the corresponding portion of the video signal will be below the threshold level so that the output of comparator 64 will remain zero, the Q output 70 will remain high, the gate 74 will remain enabled and the scaler 76 will continue counting the clock pulses.

A substantially reduced amount of reflected radiation is provided immediately below the junction 38 as a result of viewing along the viewing axis 48. The amplitude of the video signal of unit 60 therefore beings to rise. Although theoretically the amplitude of this signal should increase almost instantaneously, as a practical matter this generally does not occur. Instead as shown in FIG. 4, the amplitude increases over the next several pulses of the strobe signal (indicating a decrease in detected radiation) since (1) the lens 52 utilized can include optical defects such as chromatic aberrations, (2) reflections can occur within the optical system which as multiple internal reflections within the window 46, when the latter is placed within the optical system and (3) there is some radiation scattering from other sources which the detectors will sense as the reflected radiation of interest. Thus, by way of example, as shown in FIG. 4, the change occurs at t1 so that the amplitude of the video signal begins to change. When the amplitude of the video signal exceeds the threshold level at t2 the amplitude of the signal at the positive input of the comparator 64 will exceed the threshold level so that the output of the comparator will go from a zero or negative voltage to some positive voltage. The positive going transition of the voltage provided at the reset input of flip-flop 66 will cause the Q output 70 to go from a high to a low state disabling the AND gate 74. Once AND gate 74 is disabled, the scaler 76 will discontinue counting the strobe pulses. In the example shown in the timing diagram, this count will be 26 corresponding to the previous twenty-six strobe pulses. The video signal will continue until the entire analog shift register of sensing unit 60 is empty. After the interface has been detected even if the amplitude of the video signal should fall below the threshold level of comparator 64, causing the output of the latter to go to a zero or negative value the Q output 70 of flip-flop 66 will remain low and the AND gate 74 will remain disabled.

At the end of the video signal (when the values representative of all the detectors have been provided) the transfer pulse $\theta_A$ is provided to the transfer input 80 of scaler 76 so as to jam transfer the value in binary form from scaler 76 to latch 82 (in the example of FIG. 4, this value being 26). The latch 82 will hold this value until the next scan (of the next set of readings sequentially provided from the analog register) is completed and an update is provided from the output of scaler 76. The value in latch 82 is a digital signal and applied to the input of the digital-to-analog converter 84. The analog output of converter 84 is conditioned and shaped by amplifier 86 and applied through the switch 88 to the summary amplifier 100. If the solid/liquid/vapor junction 38 is in its proper position, the output of the summing junction and thus the output of the controller 104 is such that the signal applied to the heating elements is substantially constant and the temperature gradient at the growth interface remains at the desired value. When initially using the control system the switch 88 is first set to position 98 (ground) so that the SCR controller and heater only respond to adjustments of potentiometer 102. Steady state growth is obtained by starting pulling machanism 32, while potentiometer 102 is adjusted to reduce the power to the heater. When steady state growth is obtained, the pulling speed and the position of the solid/liquid interface 36 will be constant. Voltage source 92 is then adjusted so that zero volts appear at point 96. Then the switch 88 is thrown to automatic, thereby connecting the automatic control circuit. Initially, nothing happens since both terminals 96 and 98 are at the same potential, i.e. ground. However, if the interface position subsequently rises or falls due to disturbances to the system, then a signal will automatically be supplied to terminal 96, tending to cause a correction to the initially selected solid/liquid interface position.

The system continually repeats the scan of the values in the analog register and therefore periodically provides an update. Where a change in the number of pulses counted in scaler 76 occurs when AND gate 74 is disabled, the new value is jam transferred to latch 82, the analog output of converter 84 will provide a larger or smaller signal to the input of amplifier 100, changing the signal to the controller 104 so as to raise or lower the heat applied to the melt material.

The system just described is useful in effectively controlling meniscus height. This system is particularly useful in the growth of crystalline bodies which have a closed geometry, e.g. cylinders of rods, having no edges or the growth of flat sheet crystals having stable edges. In these cases, the maintenance of the thickness of the crystalline body is of chief importance and the heater elements being controlled are typically equally effective around the perimeter of the die top. Alternatively the thickness can be controlled by controlling the pulling speed. However, it has been observed during the growth of crystalline bodies of an open geometry, such as flat ribbons, that excellent temperature control is very important near the ends of the die if the position of the ribbon edges is to be maintained. As an example, during steady state growth, one edge of the body often will recede from one edge of the top of the die member while the other edge of the body spreads toward the other edge of the top of the die member. Lowering the temperature at one die top edge inhibits the receding of a body edge while raising the temperature at a die top edge inhibits the spreading of a ribbon edge. To obtain this temperature control special end heaters have typically been incoporated into the design of systems used for growing crystalline bodies of an open geometry. in accordance with the present invention, an edge control and monitoring system is provided for monitoring the cross-sectional dimensions of the body, preferably near the solid/liquid interface in order to control the temperature distribution across the top 26 of the die member 20 and in the meniscus, especially in the regions where the edges of the ribbon are grown.

The system includes means for monitoring the relative position of the vertical edges of the body 16 relative to each other as well as the absolute position of each edge during steady state growth, so as to control the growth of the crystalline body.

Figure 5:
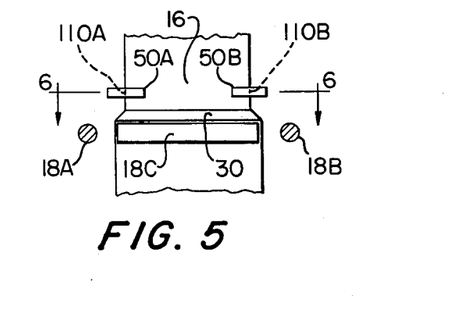
FIG. 5 is a schematic view on an enlarged scale illustrating a preferred form of the present invention as combined with the furnace of FIG. 1.
Figure 6:
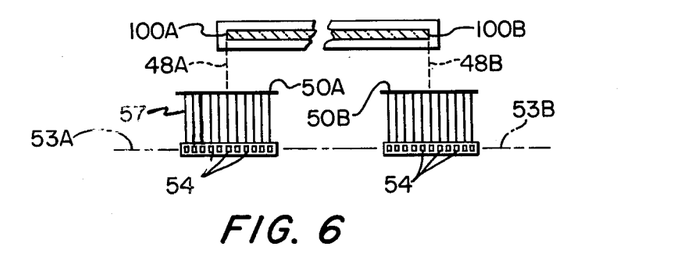
FIG. 6 is a cross-sectional plan view taken along line 6—6 in FIG. 5.

More specifically, referring to FIGS. 5 and 6, images of at least the opposite edge portions 110A and 110B of the body 16, just above the solid/liquid interface 36 are observed by the respective edge control sensors 50A and 50B provided in appropriate viewing ports, of the type shown in FIG. 1 at 44. The sensors 50A and 50B are identical to the sensor 50 utilized in the meniscus height monitoring and control system, except that the radiation detectors 54 of each sensor 50A and 50B are preferably oriented as a linear array in generally a horizontal direction, perpendicular to the corresponding viewing axis 48A and 48B, coplanar with the respective image planes 53A and 53B.

The preferred control circuit of each edge monitoring and control system is identical to the circuit shown in FIG. 3, except that the input terminal connections to the comparator 64 are reversed with the output of the unit 60 connected to the negative input terminal and a variable DC reference signal connected to the positive input. The reversal of input terminal connections is provided so that the detectors 54 are arranged whereby the values representative of the radiation received by each detector, and stored in the analog shift register of the sensing unit 60, correspond in sequence to the radiation received by the detectors 54 of the edge control sensor 50A from the background through the edge portion 110A to the crystalline body (shown from left to right in FIG. 6, and the radiation received by the detectors 54 of the sensor 50B from the background through the edge portion 110B to the crystalline body (shown from right to left in FIG. 6). In both situations, it is preferred to begin the sequence with the pulses corresponding to the background since this provides a more stable operation than starting the sequence with the pulses corresponding to the body 16. As such the portions of the image received in the image plane 53A and 53B, corresponding to the background, will be dark, while the portions of the body 16 in the image planes will be light due to the fact that the portions of the body, which are just above the meniscus are still irradiating light and heat prior to cooling down.

Figure 8:
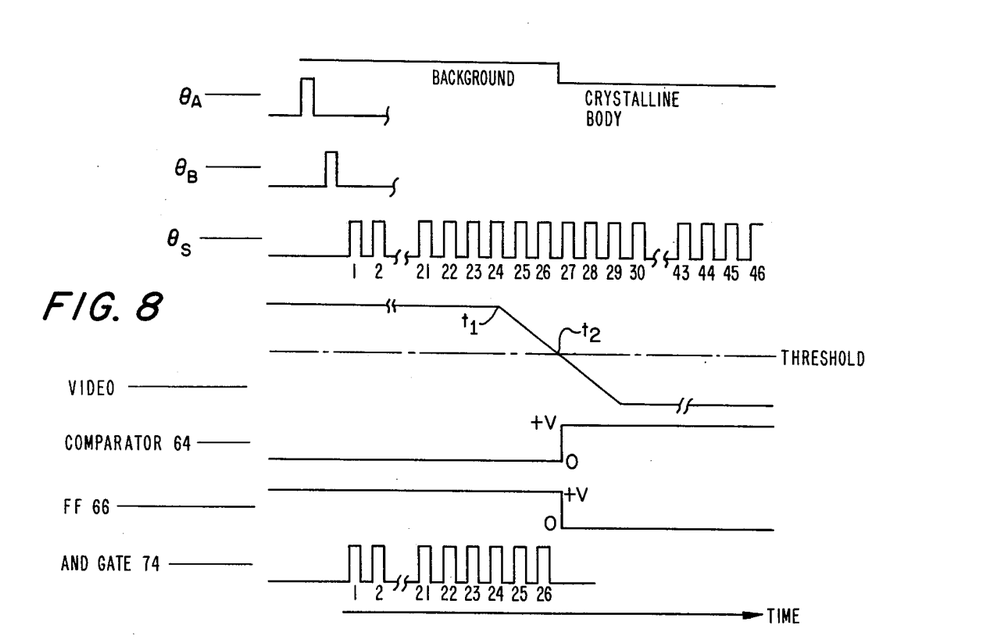
FIG. 8 is an exemplary timing diagram of the block diagram of FIG. 7.

The video signal output of the unit 60 of each of the monitoring sensors 50A and 50B, shown as a continuous signal in FIG. 8 is therefore a series of pulsed analog signals representative of the outputs of the corresponding detectors, which signals will be of a relatively small negative (or zero) amplitude corresponding to the portions of the relatively dark background and of a relatively greater negative amplitude corresponding to the portions of the body observed. Accordingly, as shown in FIG. 8, the negative amplitude of the analog signals increases at the edge portion 110 formed by the vapor/solid junction of the body observed. Generally, the comparator 64A provides an output which is at a low or negative logic state so long as the voltage at the negative input is above (more positive) than the threshold voltage at its positive input. The output of the comparator 64A however, changes to a high or positive logic state when the voltage at its negative input falls below the reference voltage at its positive input. In this way the output of comparator 64A can be used with the control logic shown in the same manner as previously described with regard to the meniscus height monitoring and control system to provide an analog output from converter 84 which is a function of the position of the edge portion. However, as shown, an increase in analog signal will occur when the edge portion observed recedes (toward the center of the die member) from the steady state position. In this situation it is desirable to provide a decrease in power to the particular heater element being controlled. The summing amplifier 90A is accordingly modified from the amplifier 90 shown in FIG. 3 to include an inverter for inverting the analog input signal from the converter 84. Thus, an increase of the output of the converter 84 from the value provided during steady state growth, will provide a negative going output signal from the amplifier 90A so as to decrease the power to the heater being controlled. Similarly, a decrease of the output of the converter 84 from the value provided during steady state growth, will provide a positive going output to increase the power to the heater being controlled.

Figure 7:
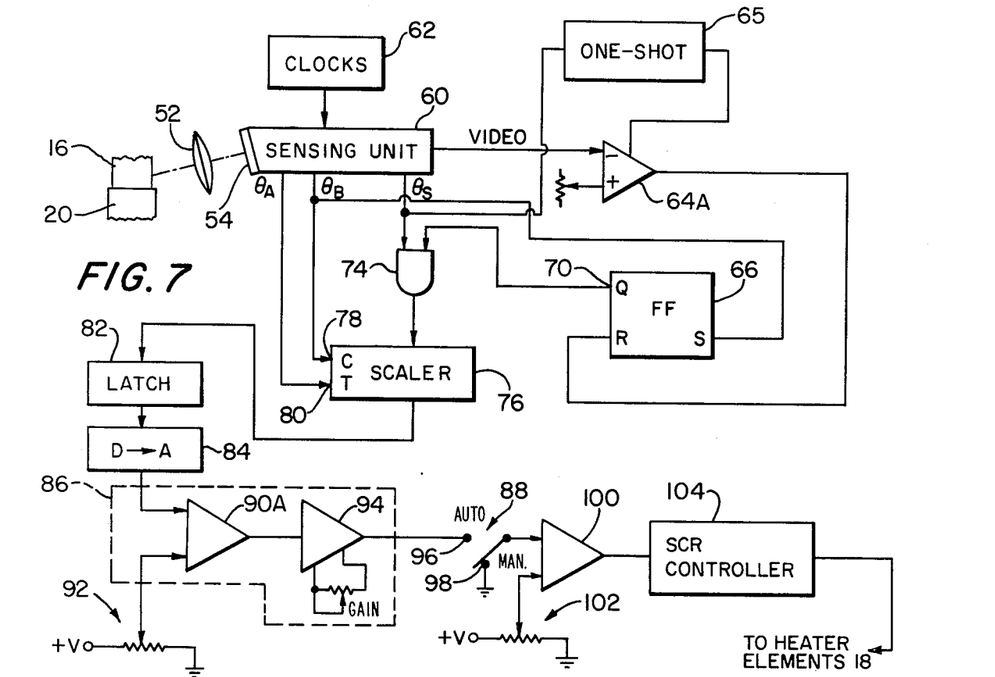
FIG. 7 is a schematic block diagram illustrating further aspects of the preferred embodiment of the invention.

In operation, each of the edge control sensors 50A and 50B are properly positioned with respect to a port or ports 44 so as to observe, respectively, the opposite edge portions 110A and 110B along the corresponding viewing axes 48A and 48B. In the case where the monitoring is to control the growth of crystalline bodies in resistance heater furnaces, the output of the SCR controller 104 responsive to the system including sensor 50A is preferably connected to the end heater 18A and the output of the SCR controller 104 responsive to the system including sensor 50B is preferably connected to the end heater 18B. As the crystal is growing, the monitoring system is designed to continually monitor and control the horizontal position of each of the edge portions 110A and 110B with respect to each other as well as to the absolute positions of each edge during steady state growth. Referring to the timing diagram of FIG. 8, the operation of the circuit of the edge monitoring and control system in FIG. 7 is almost identical to that of the circuit of the meniscus height control system shown in FIG. 3. Specifically, a transfer pulse $\theta A$ is provided to jam transfer the value in the scaler 76 from the previous scan into latch 82. The clearing pulse $\theta B$ then clears the scaler 76 for the next scan and sets flip-flop 66 so that the Q output 70 of the flip-flop goes high and AND gate 74 is enabled. Signals, representative of the amount of radiation received by the detectors 54 are simultaneously stored in the analog shift register of the control circuit 60 and subsequently provided as a series of pulse analog video output signals. Since the portions of the video signal representative of the background are provided first, the values of the video signal applied to the negative input of the comparator 64 will be greater than the input to the positive input terminal so that the reset input of flip-flop 66 remains low. With AND gate 74 thus enabled, each clocking pulse $\theta S$ will be clocked into the scaler 76 until the video signal falls below the threshold level. This will occur at the particular edge portion 110 where a sharp change in contrast between the background and the crystalline body occurs. With this increase in radiation, the analog signals of the video go more negative and thus fall below the setting of the threshold level as shown. This will occur with respect to those portions of the image where a sharp change in contrast between the background and the crystalline body edge occurs because of the sharp change in radiation between the background and body. With this increase in radiation, the analog signals of the video output fall below the threshold level of the comparator 64 so that the output of the latter goes high resetting flip-flop so that the Q output of the flip-flop goes low, disabling AND gate 74. This completes the count in the scaler for the particular scan. The transfer pulse $\theta A$ jam transfers the count in the scaler to the latch 82 which in turn provides the digital signal output to the digital-to-analog converter 84. The output of the converter 84 is conditioned and shaped and inverted by the amplifier 86 in a manner previously described and then applied through the switch 88 to the summing amplifier 100. Thus, control action is taken to maintain a temperature distribution across the top end of the die member and in the meniscus and in particular in the regions near the side edges of the top end of the die member where the edges of the crystalline body are growing, which is appropriate for keeping the edge portions fixed.

In order to set the desired power level of the output of each controller 104 which provides steady state growth, the switch 88 for both edge monitoring and control systems are initially connected in the manual position to ground through terminal 98. Growth is intitiated by bringing a seed crystal in contact with the melt at the top end of the die member, reducing the power input to the heaters 18 (particularly to the face and end heaters 18A, 18B and 18C) while starting to pull the body with the pulling mechanism 32. The output from the summing amplifier 100 will represent the signal from the particular voltage source 102 at the input of the amplifier. Once the desired steady state growth conditions are obtained, the output of amplifier 86 is movably offset to zero or ground level by adjusting voltage source 92, the switch 88 is thrown to connect the output of the amplifier to the summing amplifier 100. This is done for both edge control systems. The system then begins to automatically operate in the manner described. Thus, when either edge portion 110 of the body is receding from the die edge away from the end heater element 18A or 18B the die top and melt temperature near the edge of the top end of the die is too high and a reduction in power to that end heater will occur. Similarly, when either edge portion 110 of the body extends away from the steady state position the edge of the top end of the die member and the end heater, the temperature is below the desired temperature and an increase in power is provided to the end heater. It is noted that if the body shifts horizontally on the die top, one sensor will see the edge portion receding from the die edge while the other sensor will see the edge portion extending toward the adjacent die edge. In this situation the system associated with the first sensor will provide decreased power to the adjacent end heater while the system associated with the other sensor will provide an increase in power to the other end heater.

In the instance where end heater 18A is controlled by the system including sensor 50A (hereinafter referred to as the left edge sensor) and end heater 18B is controlled by the right edge control system including sensor 50B (hereinafter referred to as the right edge sensor) it is not necessary to control the face heater 18C since it presumably provides substantially constant heat across the die top with the end heaters being used to control any differences between the temperatures at the two ends. It has been found that in those situations where the crystal bodies being grown are of an open geometry type, the edge control technique thus described allows automatic control for periods up to an hour with occasional human intervention. Usually, this intervention is in the form of making an independent adjustment of the power applied to the face heater 18C or to the pulling speed.

In order to provide even greater control of the growth of the crystalline body 16, it is therefore preferred to also control the face heater 18C. This may be accomplished for example by (1) using both the edge control and meniscus height control systems as shown in FIG. 9, (2) using both the left and right edge monitoring and control systems to not only control the end heaters but also the face heater such as shown in FIG. 10, or (3) by using an "unbalanced" control system with the face heater being controlled by only one of the edge controllers such as shown in FIG. 11.

Figure 9:
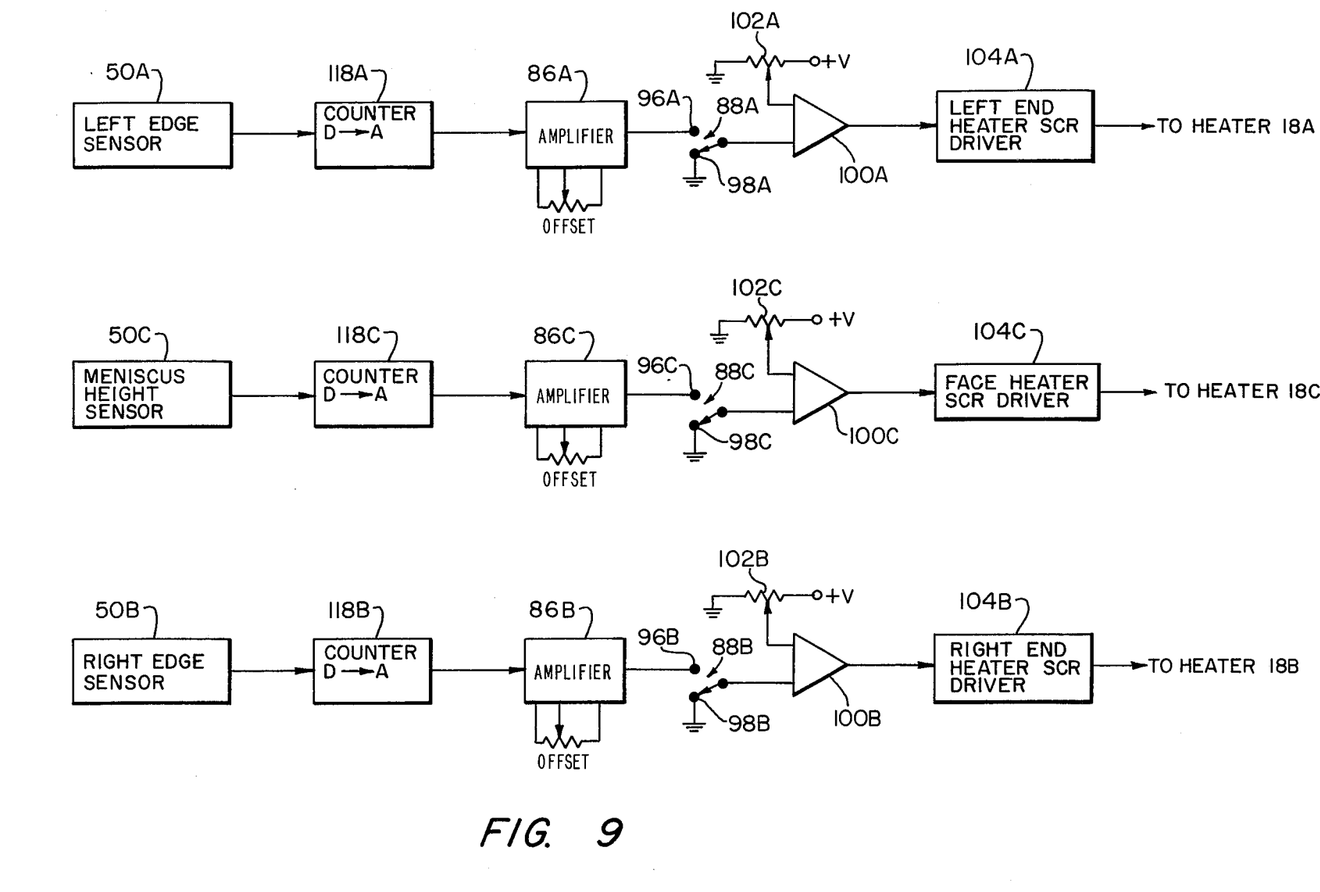
FIGS. 9-11 are schematic block diagrams, each illustrating an embodiment of a crystal growth monitoring and control system employing both the meniscus height monitoring and control system and techniques of our copending application and the principles of the present invention.

More specifically referring to FIG. 9 the left edge and right edge sensor 50A and 50B observe the horizontal positions of the left and right edge portions 110A and 110B, respectively while the meniscus height sensor 50C observes the vertical position of the solid/liquid interface 36 of the meniscus 29 near the middle portion of the interface 36. As previously described each monitoring and control system provides a video signal output which (as generally indicated at 118) is converted into a pulse count indicative of the particular position being observed, subsequently converted to an analog signal, and applied to the particular amplifier 86. Once steady state growth is obtained, the output of each amplifier 86 is applied through the switch 88 to the summing amplifier 100. The output of the amplifier 100A, 100B and 100C are thus applied to the corresponding SCR controller 104A, 104B and 104C which in turn provides a regulated power level to the corresponding end and face heaters 18A, 18B and 18C; respectively.

Figure 10:
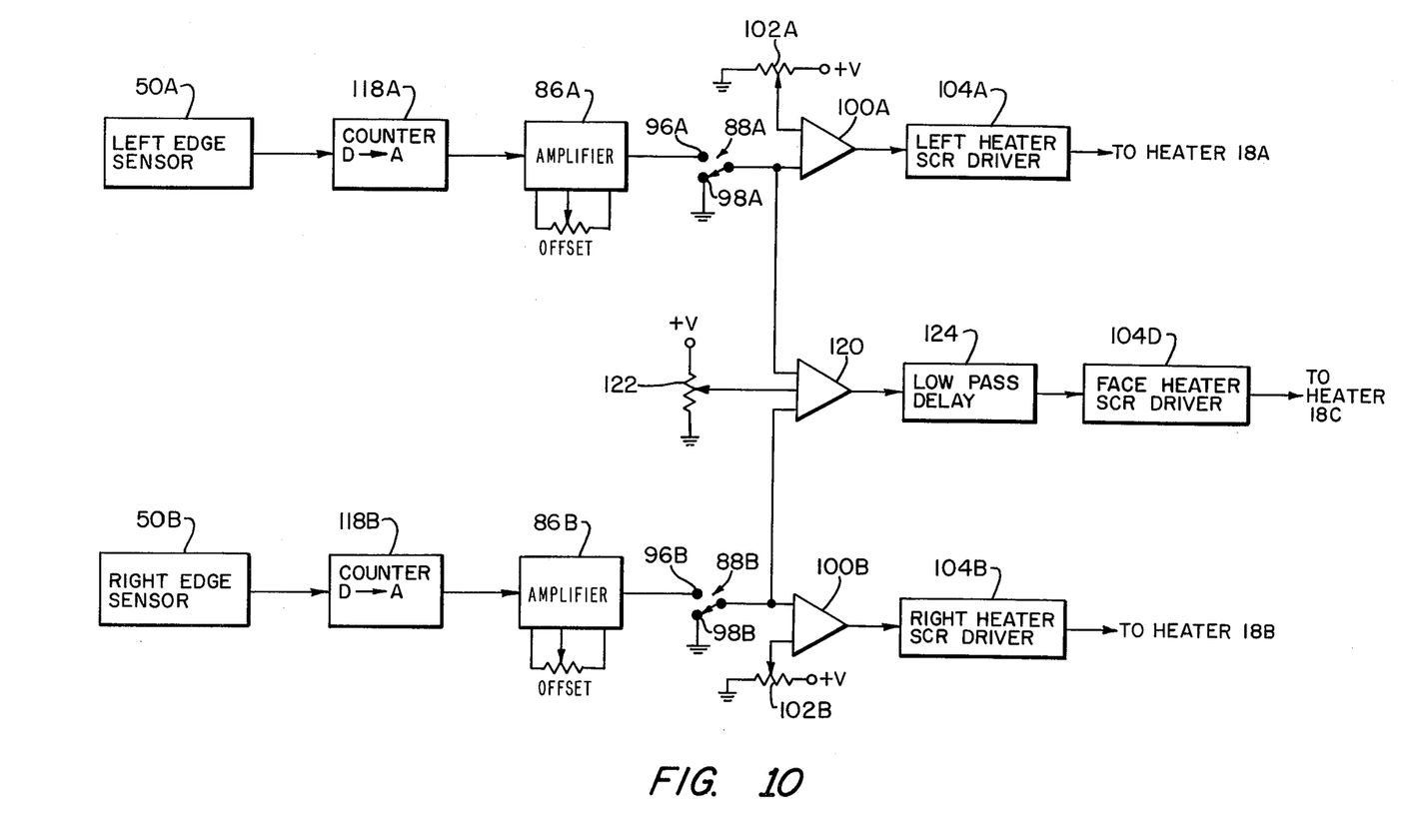

Refering to the embodiment shown in FIG. 10, the embodiment of FIG. 9 is simplified by deleting the meniscus height sensor 50C and associated portion 118C to the control circuit, and the output of each of the amplifiers 86A and 86B (as provided at the inputs of summing amplifiers 100A and 100B) are respectively applied to two of the three inputs of summing amplifier 120. The third input of the latter amplifier receives a signal from the variable reference voltage source 122. Summing amplifier 120 adds the signals provided at the three inputs, amplifies the resultant signal before applying it to a low pass delay 124. The delay 124 is provided so that the SCR controller 104D, connected to receive the output of the delay, is less sensitive to fluctuation errors in the signal outputs of the two amplifiers 86A and 86B. Preferably, the delay is in the form of an integrator so as to average out errors in the signal output of the amplifier 120. The output of delay 124 is applied to the SCR controller 104D which in turn provides the power to the face heater 18C. In operation, the switches 88A and 88B are both connected in the manual position, i.e. to terminals 98A and 98B respectively, and steady state growth is achieved by adjusting the potentiometers 102A and 102B and the voltage source 122 while operating pulling mechanism 32. The outputs of the amplifiers 86A and 86B are adjusted to zero as previously described and the switches 88A and 88B are moved to the automatic position, i.e. connected to terminals 96A and 96B so that automatic control is provided. A shift in the body 16 causing an increase in power to one end heater and a corresponding decrease in power to the other end heater will not affect the power to the face heater 18C since the total sum of the signals provided at the input of amplifier 120 remains the same. However, where the die top and the nearby melt temperature is too high, causing both edge portions 110A and 110B to recede, a decrease in power is provided to the end heaters 18A and 18B as well as a decrease in the total input to summing amplifier 120 resulting in a decrease in power to the face heater 18C. Similarly, where the edge portions 110A and 110B both move toward the die ends, indicating that the die top and nearby melt temperature is too low, the power to the end heaters is increased and the inputs to amplifier 120 are increased providing more power to the face heater.

Figure 11:
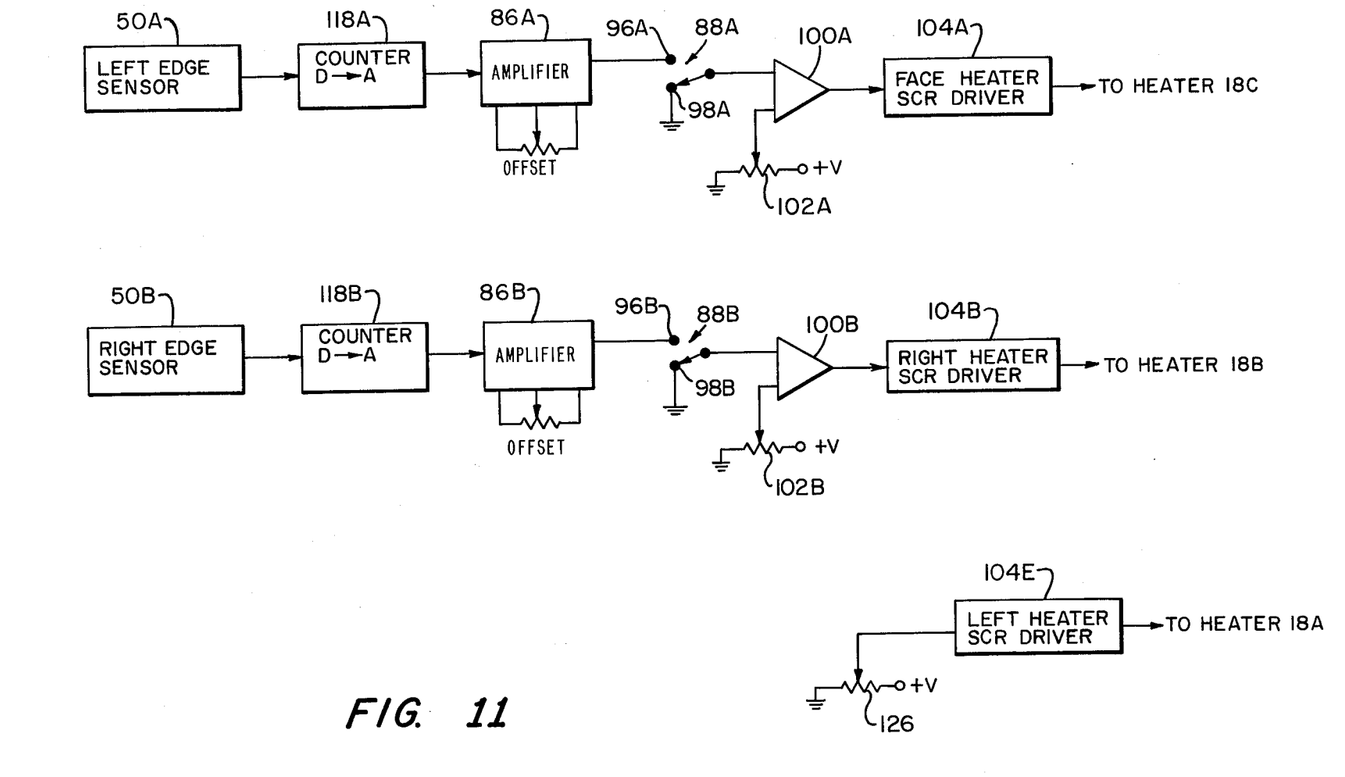

The unbalanced system shown in FIG. 11 takes advantage of the fact that when the die top and nearby melt temperature is too high both the meniscus height will increase and the edge portions 110 will recede. As a consequence, one of the edge controllers can be used to control the face heater. For example, the system shown utilizes changes in the position of the edge portion 110A to control the face heater 18C and changes in the edge position 110B to control the end heater 18B. In this situation the remaining end heater 18A is controlled by a constant voltage source 126 which provides a constant signal input to the SCR controller 104E which drives the end heater 18A.

It will be appreciated that although the preferred embodiment of the invention has been described with reference to the use of detectors 54 which sense the radiation received by each at the same time and the unit 60 which includes an analog shift register for storing the signal so that they can be sequentially scanned, alternatively, each of the detectors can be sequentially energized to provide a series of analog signal pulses each representative of the output of the respective detector so as to eliminate the need for an analog shift register.

Although the invention has been described in connection with controlling the interface temperature of the melt materials, the crystal growth can also be controlled by adjusting the pulling speed of the crystalline body by mechanism. In such a case the controller 104 of FIG. 3, controller 104C in FIG. 9, controller 104D in FIG. 10 and controller 104A of FIG. 11 can be suitably connected to vary the pulling speed.

The invention thus described has several advantages. The growth of a crystalline body, notably a silicon body, can be monitored and controlled simply and easily, so that the cross-sectional dimensions of the growing body are within prescribed limits. By observing the growth of the body electronically, and utilizing automatic controls to control the speed of pulling of the crystal or the temperature of the melt material, the control is not dependent upon human observation and thus is not subject to human errors which can arise from the psychologically stressful nature of optically observing the meniscus with the human eye as taught by La-Belle in U.S. Pat. No. 3,870,477. By observing the crystalline body at the edge portions an improved control system is provided, particularly in the case where the body being grown is of the open geometry type. Further, by controlling both the end heaters as well as the face heater, even greater control of the cross-sectional width of the growing body is achieved.

What is claimed is:

1. Apparatus for growing a crystalline ribbon-shaped body of selected material having oppositely disposed edges along its length, said apparatus comprising (1) growing means for growing and pulling said crystalline body from a growth pool of melt supplied by a capillary die, said growing means including first and second heater means for selectively providing heat to the respective portions of said growth pool adjacent said edges of said body, and (2) means for replenishing said growth pool with melt provided from a reservoir supply of melt, said growth pool being characterized by a meniscus which joins said body above said capillary die at a solid/liquid interface, said apparatus further comprising:

means for observing at least a portion of said body above said meniscus at each of said oppositely disposed edges against a contrasting background, and control means for independently maintaining each of said observed portions of said edges at a select spatial position with respect to a predetermined reference position as well as to each other, said control means including means for selectively controlling said first and second heater means so as to control the temperature of the portion of said growth pool of melt adjacent each of said edges.

2. Apparatus in accordance with claim 1 wherein said means for observing said portions of said body at each of said edges and said contrasting background includes means for forming an image of preselected points of said portion and background in an image plane and an array of detectors positioned in said image plane so as to detect radiation recovered from each of said points with a corresponding one of said detectors.

3. Apparatus in accordance with claim 2 wherein said means for forming an image of at least said preselected points includes means for focusing said image with focusing lens means.

4. Apparatus in accordance with claim 1 wherein said means for observing said portions of said body at each of said edges and said contrasting background includes means for transmitting the radiation provided from each of preselected points of said portions and background to a corresponding one of a plurality of detectors.

5. Apparatus in accordance with claim 4 wherein said means for transmitting the radiation includes a coherent fiber optic bundle.

6. Apparatus in accordance with claim 5 wherein the radiation provided from each of said points is transmitted through an optical fiber of said fiber optic bundle to a corresponding one of said detectors.

7. Apparatus in accordance with claim 1 wherein said first and second heater means are each responsive to a separate control signal and disposed near a corresponding one of said portions of said growth pool of melt adjacent each of said edges for selectively providing heat to the portion of said growth pool of melt adjacent each of said edges.

8. Apparatus in accordance with claim 7 wherein means for observing at least a portion of said body above said meniscus at said oppositely disposed edges and said contrasting background includes means for selectively detecting the quantity of radiation provided from each of preselected points of said portions of said body and background; means for converting each of said quantities into a corresponding electrical signal representative of said quantity; means for processing said signals so as to provide the control signal representative of where said quantities of radiation provided from said preselected points exhibit a sharp change; and means for applying said control signal to the corresponding heater means to which said heater means is responsive.

9. Apparatus for growing a crystalline ribbon-shaped body from a growth pool of melt of a select material, said body having oppositely disposed edges for some preselected distance along its length, said growth pool being characterized by a meniscus which joins said body at said growth pool, said apparatus comprising:
means for observing at least a portion of said body above said meniscus at each of said oppositely disposed edges against a contrasting background,
means for determining the spatial positions where a sharp contrast in the amount of radiation provided by said body and background occurs;
means for referencing said spatial positions relative to some predetermined reference spatial position; and control means for selectively controlling the observed spatial position of said sharp contrast relative to said reference spatial position for each of said edges, said control means including first and second heater means for selectively providing heat to the respective portions of said growth pool adjacent said edges of said body.

10. Apparatus in accordance with claim 9 wherein said material is silicon.

11. Apparatus in accordance with claim 9 wherein said material is germanium.

12. Apparatus in accordance with claim 9 wherein said means for observing said portions of said body and background includes means for detecting the quantities of radiation of a preselected wavelength provided from preselected points of said portion of said body and background at each of said oppositely disposed edges and for generating two pluralities of electrical signals, corresponding respectively to said quantities of radiation detected from each of said portions of said body and background.

13. Apparatus in accordance with claim 12 wherein each of said plurality of electrical signals are a sequence of pulses, the magnitude of each of said pulses corresponding to the magnitude of a corresponding one of said detected quantities of radiation.

14. Apparatus in accordance with claim 13 further including means for comparing the magnitude of each of said pulses with a preselected magnitude level and means for counting the number of pulses exceeding said preselected level.

15. Apparatus in accordance with claim 14 further including means for converting the number of pulses of each of said pluralities counted by said counting means to a corresponding second electrical signal, the magnitude of said second signal corresponding to said number of pulses, wherein said control means includes means for generating a control signal in response to each of said second signals and said first and second heater means is responsive respectively to the control signals.

16. Apparatus in accordance with claim 14 wherein said number of pulses exceeding said preselected level corresponds to the distance between said spatial position and said reference spatial position.

17. Apparatus for growing a crystalline body from a growth pool of melt of a selected material so that said body has a substantially rectangular cross-sectional shape and oppositely disposed edges for some preselected distance along its length, said growth pool being supplied by a capillary die and characterized by a meniscus which joins said body at said growth pool above said capillary die, said apparatus comprising:
means for observing at least a portion of said body above said meniscus at each of said oppositely disposed edges against a contrasting background,
means for determining the spatial position where a sharp contrast in the amount of radiation provided by said body and background at each of said edges occurs;
means for referencing said spatial position of each of said edges relative to some reference spatial position; and
compensation means including first and second heater means respectively positioned near said opposite edges adjacent said growth pool for compensating for temperature differences existing in said growth pool between said oppositely disposed edges so that the spatial position of said sharp contrast at each of said edges can be controlled relative to said reference position.

18. In an apparatus for growing a crystalline body of selected material from a growth pool of melt so that said body has a substantially rectangular cross-sectional shape and oppositely-disposed edges for some preselected distance along its length, said growth pool being supplied by a capillary die and characterized by a meniscus which joins said body at said growth pool above said capillary die, said apparatus comprising means for observing said body and said meniscus along an axis which is perpendicular to the surface of said meniscus where said meniscus meets said body; means for determining the vertical spatial position where a sharp contrast in reflected radiation occurs; means for referencing said vertical spatial position relative to some vertical reference spatial position; and means for controlling the speed at which said body is pulled from said growth pool or the temperature of said growth pool so that the vertical spatial position of said sharp contrast can be controlled relative to said vertical reference spatial position, the improvement comprising:

means for observing at least a portion of said body above said meniscus at each of said oppositely disposed edges against a contrasting background,     means for determining the horizontal spatial position where a sharp contrast in the amount of radiation provided by said body and background at each of said edges occurs;

means for referencing said horizontal spatial position of each of said edges relative to a respective horizontal reference spatial position; and     compensation means including first and second heater means respectively positioned adjacent said opposite edges near said growth pool for compensating for temperature differences existing in said growth pool between said oppositely disposed edges so that the horizontal spatial position of said sharp contrast at each of said edges can each be separately and independently controlled relative to the respective horizontal reference position.

19. In apparatus according to claim 18 wherein said capillary die includes a top end for supporting said growth pool, said first and second heater means each including an edge heater disposed adjacent said growth pool and said top end near a corresponding oppositely disposed edge, and said means for referencing said horizontal spatial position of each of said edges includes means for generating a control signal, representative of the distance between said hotizontal spatial position of the respective edge relative to said horizontal reference position, to the edge heater closest to said respective edge.

20. In apparatus according to claim 19 wherein said means for controlling the speed at which said body is pulled from said growth pool or the temperature of said growth pool includes means for generating a second control signal representative of said vertical spatial position relative to said vertical reference position.

21. Apparatus for growing a crystalline body of selected material so that said body has oppositely disposed first and second edges and a substantially rectangular cross-sectional shape for a selected distance along its length, said apparatus comprising means for growing and pulling said crystalline body from a growth pool of melt, and means for replenishing said growth pool with melt provided from a reservoir supply of melt, said growth pool being characterized by a meniscus which joins said body at a solid/liquid interface, said apparatus further comprising:

observation means including first and second sensing devices for respectively observing at least a portion of said body above said meniscus at each of said oppositely disposed edges against a contrasting background, and     means responsive to said observation means for generating first and second control signals the amplitudes of which are representative of the respective horizontal spatial positions of said first and second edges with respect to predetermined reference spatial positions as well as to each other; and     means including first and second heater elements disposed, respectively near said first and second edges of said body and a third heater element disposed substantially parallel to the surface of said body between said first and second edges, for controlling the temperature of said growth pool, wherein said first heater element is responsive to said first control signal and said third heater element is responsive to said second control signal.

22. Apparatus for growing a crystalline body of selected material from a growth pool of melt so that said body has a substantially rectangular cross-sectional shape and first and second oppositely disposed edges for some preselected distance along its length, said growth pool being characterized by a meniscus which joins said body at said growth pool, said apparatus comprising:

means, including a die member having a top end for supporting said growth pool and for replenishing said growth pool from a reservoir supply of melt;

means for observing at least a portion of said body above said meniscus at each of said oppositely disposed edges against a contrasting background;

means for determining the spatial position where a sharp contrast in the amount of radiation provided by said body and background at each of said edges occurs;

means for referencing said spatial position of each of said edges relative to some reference spatial position;

means for generating first and second control signals representative of the spatial positions of the corresponding first and second edges relative to the reference spatial position;

compensation means for compensating for temperature differences existing in said growth pool between said oppositely disposed edges so that the spatial position of said sharp contrast at each of said edges can each be controlled relative to said reference spatial position, said compensation means including first and second end heater means responsive respectively, to said first and second control signals and disposed adjacent said growth pool and said top end of said die member near said first and second edges respectively, and face heater means responsive to a third control signal derived from said first and second control signals and disposed adjacent said growth pool and said die member near the surface of said body between said edges.

23. A method of growing a crystalline body from a growth pool of melt of selected material so that said body has a substantially rectangular cross-sectional shape and oppositely disposed edges for some preselected distance along its length, said growth pool being supplied by a capillary die and characterized by a meniscus which joins said body at said growth pool above said capillary die, said method comprising:

observing at least a portion of said body above said meniscus at each of said oppositely disposed edges against a contrasting background;

determining the spatial position where a sharp contrast in the amount of radiation provided by said body and background at each of said edges occurs;

referencing said spatial position of each of said edges relative to some reference spatial position; and compensating for temperature differences existing in said growth pool between said oppositely disposed edges so that the spatial position of said sharp contrast at each of said edges can each be controlled relative to said reference position;

wherein said step of compensating includes selectively applying heat to each portion of the meniscus where said meniscus joins the corresponding edge of the body.

24. Apparatus according to claim 22, wherein said compensation means includes means for summing said first control signal, said second control signal and a third reference signal and for generating said third control signal in response thereto.

25. Apparatus according to claim 24, wherein said means for summing includes a low pass delay for making said third control signal less sensitive to fluctuation errors in said first and second control signals.

* * * * *